United States Patent
Vitek et al.

(10) Patent No.: US 10,193,049 B2
(45) Date of Patent: Jan. 29, 2019

(54) THERMOELECTRIC GENERATOR UNIT (75) Inventors: Christian Paul Vitek, Boos-Reichau (DE); Boris Kienle, Biberbach (DE)

(73) Assignee: FAURECIA EMISSIONS CONTROL TECHNOLOGIES, GERMANY GMBH (DE)

(*) Notice: Subject to any disclaimer, the term of this patent is extended or adjusted under 35 U.S.C. 154(b) by 991 days.

(21) Appl. No.: 14/004,189

(22) PCT Filed: Mar. 12, 2012

(86) PCT No.: PCT/EP2012/001097
§ 371 (c)(1),
(2), (4) Date: Dec. 18, 2013

(87) PCT Pub. No.: WO2012/123096
PCT Pub. Date: Sep. 20, 2012

(65) Prior Publication Data
US 2014/0150840 A1    Jun. 5, 2014

(30) Foreign Application Priority Data

Mar. 11, 2011 (DE) .................. 10 2011 013 622

(51) Int. Cl.
*F01N 5/02* (2006.01)
*H01L 35/32* (2006.01)
(Continued)

(52) U.S. Cl.
CPC .............. *H01L 35/32* (2013.01); *F01N 3/043* (2013.01); *F01N 5/025* (2013.01); *H01L 35/30* (2013.01);
(Continued)

(58) Field of Classification Search
CPC .......... H01L 35/30; H01L 35/32; F01N 5/025
See application file for complete search history.

(56) References Cited

U.S. PATENT DOCUMENTS 4,448,028 A * 5/1984 Chao et al. .................. 136/210
5,232,516 A * 8/1993 Hed .......................... H01L 35/30
                                                    136/203
(Continued)

FOREIGN PATENT DOCUMENTS

DE     10 2008 002095 A1    12/2009
DE     102008002095 A1 *    12/2009
(Continued)

OTHER PUBLICATIONS

Machine translation of DE 102009058550 A1.*
(Continued)

*Primary Examiner* — Jennifer K Michener
*Assistant Examiner* — William E McClain
(74) *Attorney, Agent, or Firm* — Carlson, Gaskey & Olds, P.C.

(57) ABSTRACT

A thermoelectric generator unit, in particular for coupling to an exhaust gas pipe of an internal combustion engine, comprises at least one inner tube (16) having gas flowing therein and whose outer circumference comprises at least one flat portion (24). An oval outer housing (12) completely surrounds the inner tube (16) in circumferential direction. A plurality of thermoelectric modules (14) are arranged on the flat portions (24) of the inner tube (16). At least one cooling element (18) is provided which comprises a flat side on which the thermoelectric modules (14) are arranged. The assembly unit made up of inner tube (16), thermoelectric modules (14) and cooling element (18) is surrounded by an elastic compensation element (20) which rests on the inner side of the outer housing (12) and is retained in the outer housing (12) by means of clamping.

13 Claims, 3 Drawing Sheets

(51) Int. Cl.
*F01N 3/04* (2006.01)
*H01L 35/30* (2006.01)

(52) U.S. Cl.
CPC ...... *F01N 2410/02* (2013.01); *F01N 2470/10* (2013.01); *Y02T 10/16* (2013.01); *Y02T 10/20* (2013.01)

(56) References Cited

U.S. PATENT DOCUMENTS

| | | | |
|---|---|---|---|
| 5,968,456 A | 10/1999 | Parise | |
| 6,986,247 B1* | 1/2006 | Parise | 60/284 |
| 2003/0098143 A1* | 5/2003 | Winkle | 165/46 |
| 2008/0201949 A1* | 8/2008 | Kroner | 29/890.08 |
| 2009/0038302 A1* | 2/2009 | Yamada | F01N 3/0205 60/320 |
| 2009/0301538 A1* | 12/2009 | Lindstrom | 136/201 |
| 2010/0024859 A1* | 2/2010 | Bell et al. | 136/201 |
| 2011/0067742 A1* | 3/2011 | Bell | F01N 3/043 136/204 |
| 2011/0120106 A1 | 5/2011 | Bruck et al. | |
| 2011/0258995 A1* | 10/2011 | Limbeck et al. | 60/320 |
| 2011/0311421 A1* | 12/2011 | Backhaus-Ricoult | B01D 53/9477 423/213.2 |
| 2012/0125015 A1* | 5/2012 | Renze | F25B 21/02 62/3.7 |
| 2012/0297755 A1* | 11/2012 | Adldinger et al. | 136/201 |

FOREIGN PATENT DOCUMENTS

| | | |
|---|---|---|
| DE | 102009058550 A1 * | 1/2011 |
| DE | 10 2010 033607 A1 | 2/2012 |
| JP | 11055973 | 2/1999 |
| JP | 2000018095 | 1/2000 |
| JP | 2004 360522 A | 12/2004 |
| KR | 1020100120339 | 11/2010 |
| WO | 2009082534 | 7/2009 |
| WO | WO 2010057578 A2 * | 5/2010 |
| WO | 2012016684 A1 | 2/2012 |

OTHER PUBLICATIONS

International Search Report from corresponding PCT application PCT/EP2012/001097.
Translation of International Preliminary Report on Patentability from counterpart PCT/EP2012/001097, dated Sep. 26, 2013.
English translation of office action issued in corresponding Korean application.

* cited by examiner

THERMOELECTRIC GENERATOR UNIT

CROSS-REFERENCE TO RELATED APPLICATIONS

This application is the U.S. national phase of PCT/EP2012/001097, filed Mar. 12, 2012, which claims priority to DE 10 2011 013 622.3, filed Mar. 11, 2011.

TECHNICAL FIELD

The invention relates to a thermoelectric generator unit, in particular for coupling to an exhaust gas pipe of an internal combustion engine.

BACKGROUND

The possibility to recover energy from the heat of the exhaust gas of e.g. motor vehicles becomes more and more attractive in view of increasing fuel prices. With the aid of so-called thermoelectric modules, it is possible to produce electric energy from the heat energy of the exhaust gas. In these modules, so-called thermoelectric elements convert a difference in temperature into an electric voltage according to the Seebeck effect. Such thermoelectric modules are usually composed of many serially connected thermoelectric elements and are on the market in the form of flat, thin and encapsulated units.

The more thermoelectric modules can be set in direct contact with the heat of the exhaust gas, the greater the yield of electric energy. Further, the larger the difference in temperature across the thermoelectric modules from the high-temperature side to the low temperature side, the greater the yield of electric energy. Accordingly, the configuration of the thermoelectric generator unit is of great importance.

It is the objective of the invention to provide a thermoelectric generator unit which offers a high yield of electric energy and has a compact construction.

SUMMARY

A thermoelectric generator unit comprises at least one inner tube having gas flowing therein and an outer circumference that comprises at least one flat portion. An oval outer housing completely surrounds the inner tube in circumferential direction and a plurality of thermoelectric modules are arranged on the at least one flat portion of the inner tube. At least one cooling element comprising a flat side is provided, the thermoelectric modules being arranged on the flat side of the cooling element. An assembly unit is made up of the inner tube, the thermoelectric modules, and the cooling element. The assembly unit is surrounded by an elastic compensation element which rests on an inner side of the outer housing and is retained in the outer housing by clamping. Due to the oval outer contour, the thermoelectric generator unit provides the opportunity to accommodate large-area hot and cold surfaces in an interior, with the possibility to arrange thermoelectric modules thereon. By way of canning technologies such as wrapping or shrinking known from the manufacturing of exhaust gas purification units, by assembling two half shells or by packing, a quick and reliable assembly of the inner tube and the cooling elements in the outer housing can be achieved, with the circumferential alignment of the installed elements in the housing being simplified due to its oval cross-sectional shape.

An oval in the sense of the present invention is not a circle, but an elongated, round formation with a convex outer contour, with the possibility that longitudinal sides may have straight portions, too.

The invention relates in particular to ovals with one or two axes of symmetry, furthermore in particular generator units with an elliptic outer housing as a special form of the oval.

It is preferred that the inner tube and the cooling elements are fastened in the outer housing by clamping only.

Here, the outer circumference of the cooling element is preferably selected such that it corresponds in a first portion substantially to the curvature of the outer housing and is substantially flat in a second portion. The cooling element rests on the thermoelectric module with the flat portion, while the curved side fits in the outer housing.

Preferably, the cooling elements are inserted in pairs, with one cooling element being provided on each side of the inner tube.

An inflow and/or outflow device for the cooling element may be arranged on a lateral surface of the outer housing so that the outer housing can be supplied with cooling agent from outside. In case a plurality of axially consecutive cooling elements are used, it would be possible here to connect these in the outer housing to one another and to provide only one over-all inflow and outflow device on the lateral surface. It would also be an advantage to provide each of the cooling elements with its own inflow or outflow device at the lateral surface and to serially connect neighboring cooling elements from outside.

In order to protect the thermoelectric modules from any damage due to excessively high temperatures, and to avoid an excessively high heat input into the cooling circuit in full-load operation, it is of advantage if the hot exhaust gas can be bypassed upon exceeding a specific exhaust gas temperature. This situation may occur with a full-load operation of the internal combustion engine, for example. To this end, the invention makes provision that at least one gas-carrying channel and a bypass channel are present in the interior of the outer housing. Via a valve (with the option that this term includes a flap, too), the hot gas (usually the exhaust gas of the internal combustion motor) can be selectively directed through the gas-carrying channel(s) and/or the bypass channel.

The several channels may be realized through at least two inner tubes, at least one of these forming a gas-carrying channel and another forming the bypass channel adjacent to the gas-carrying channel. The thermoelectric generator unit is designed such that hot gas can be selectively directed through the gas-carrying channel(s) and/or the bypass channel.

At least three inner tubes may be provided, for example, which form at least two gas-carrying outer channels and a bypass channel arranged therebetween, with the thermoelectric generator unit being designed such that hot gas, in particular the exhaust gas of the internal combustion motor, can be selectively directed through the gas-carrying outer channels and/or the bypass channel.

As an alternative to this, an inner tube may be divided in at least two outer channels and a bypass channel arranged therebetween.

It is preferred that the thermoelectric modules are arranged on the outer flat sides of the gas-carrying outer channels. As the inner tube is preferably made from a highly heat-conductive metal, heat energy will still be transferred to the thermoelectric modules even if the exhaust gas only flows through the (e.g. internal) bypass channel.

Depending on the maximum exhaust gas temperature which is to be expected or is currently measured, provision can be made to completely close the gas-carrying channels or to leave them open and to additionally activate the bypass channel simply parallel thereto.

It is preferred that the inner tube(s) has/have a rectangular cross-section. In this way, the space within the oval outer housing may be used particularly well, and the inner tube exhibits large flat portions for arranging the thermoelectric modules.

In one embodiment, the inner tube has a wide side arranged to be parallel to the long axis of the oval of the outer housing, i.e. the long axis related to the cross-section. The height of the inner tube is selected here such that the cross-section of the outer housing is utilized to the optimum. In this way, even a plurality of inner tubes may be arranged in the outer housing parallel to one another. The inner tubes may define gas-carrying channels or bypass channels.

In another embodiment, a plurality of inner tubes are provided which form gas-carrying channels, and the inner tubes have their wide side arranged to be perpendicular to the long axis of the cross-section of the outer housing. Compared to the first embodiment, the inner tubes are installed here rotated by 90°. Here too, the width and height of the individual inner tubes is adapted such that the cross-section of the outer housing is used in the best possible way. Here, the individual inner tubes have differing dimensions to optimally make use of the space in the housing interior.

Preferably, the outer housing comprises two shells which meet each other at the short axis of the outer housing, i.e. related to the oval cross-section, and are fastened to each other in this area. With this arrangement, a higher clamping force is exerted on the inner tubes and the thermoelectric module as if the shells meet each other along the long axis, which would also be possible. The deflection and spring-back of a flat shell during compressing the shells is larger than with heavily arched shells.

For making the outer housing, the shells may be pushed into each other, i.e. the edges of the shells overlap each other.

Pushing the shells towards each other or into each other is performed in particular in a force-controlled or distance-controlled manner, allowing a very precise adaptation of the clamping force to the thermoelectric modules. In the desired position, the shells are fastened to each other through welding, soldering, or another suitable fastening method, preferably by a substance-to-substance bond.

The inner tubes are preferably provided in an alternating arrangement with thermoelectric elements and cooling elements so that each side of a hot exhaust gas-carrying inner tube contacts the high-temperature side of a thermoelectric module and each its low-temperature side adjoins a cooling element each. In this way, a large number of flat thermoelectric modules can be accommodated in the outer housing.

It is possible to realize one of the inner tubes as a bypass channel, for example an inner tube arranged in the middle of the housing; this bypass channel is preferably thermally isolated at both sides with respect to adjoining inner tubes in order to prevent the thermoelectric modules from overheating. The activation of the bypass channel may be performed in the way as is described above for the first embodiment.

Here, the thermoelectric elements are preferably arranged such that module end faces are not in contact with the elastic compensation element in order to keep the mechanical load on the thermoelectric modules as low as possible.

For manufacturing the outer housing, any suitable canning technology can be employed; it is of particular advantage, however, to form the outer housing from two outer housing shells which adjoin each other approximately in the middle of the long axis (i.e. at the level of the short axis of the oval) of the outer housing. This shape of the outer housing will result in particular high clamping forces for the inner tubes, the thermoelectric modules, and the cooling elements in the outer housing.

The outer housing preferably has the shape of a cylinder.

It is preferred that none of the inner tubes is provided with a catalytically acting or filtering component with exhaust-gas cleaning effect.

BRIEF DESCRIPTION OF THE DRAWINGS

The invention will be described below in more detail on the basis of two embodiments and with reference to the attached drawings in which.

DETAILED DESCRIPTION

Figure 1:
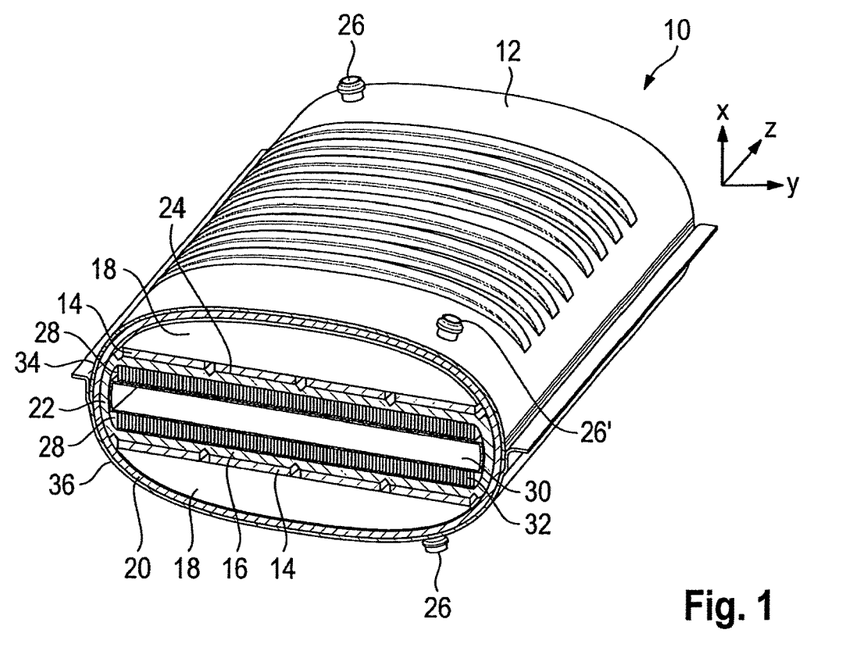
FIG. 1 shows a schematic perspective cross-sectional view of a thermoelectric generator unit of the invention according to a first embodiment.
Figure 3:
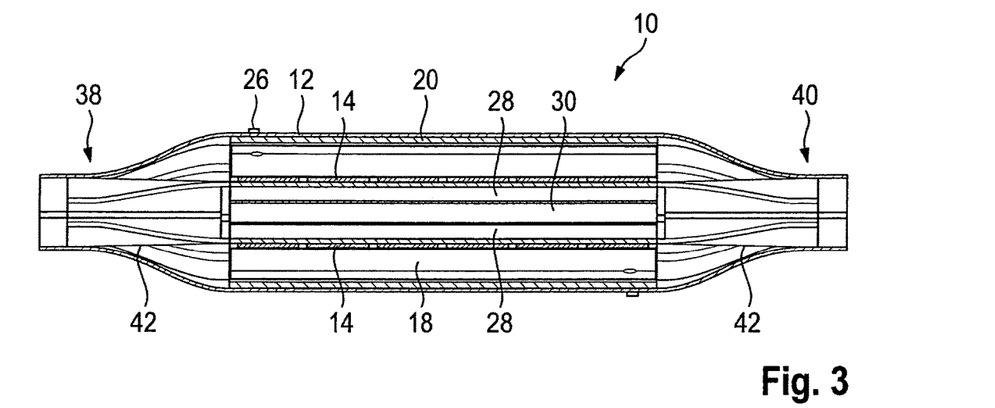
FIG. 3 shows a schematic longitudinal section through the entire thermoelectric generator unit in FIG. 1.

FIG. 1 shows a part of a thermoelectric generator unit 10 which is illustrated as a whole in FIG. 3.

An outer housing 12 with oval cross-section, here an elliptic outer housing, receives several flat thermoelectric modules 14 arranged between an inner tube 16, carrying hot exhaust gas, and two cooling elements 18. The assembly unit made up of inner tube 16, thermoelectric modules 14 and cooling elements 18 is fully surrounded over its circumference by an elastic compensation element 20, here in the form of a supporting mat provided between the assembly unit and the inner wall of the outer housing 12.

The elastic compensation element 20 as well as the assembly unit are retained in the outer housing 12 by clamping force only, as is known from so-called canning methods e.g. of units for exhaust gas purification such as catalytic converters or soot particle filters.

In this embodiment, the outer housing 12 comprises several reinforcing ribs formed parallel to the long axis y of the oval.

The outer housing 12 is made of sheet metal, i.e. is not formed as an extruded section.

Figure 2:
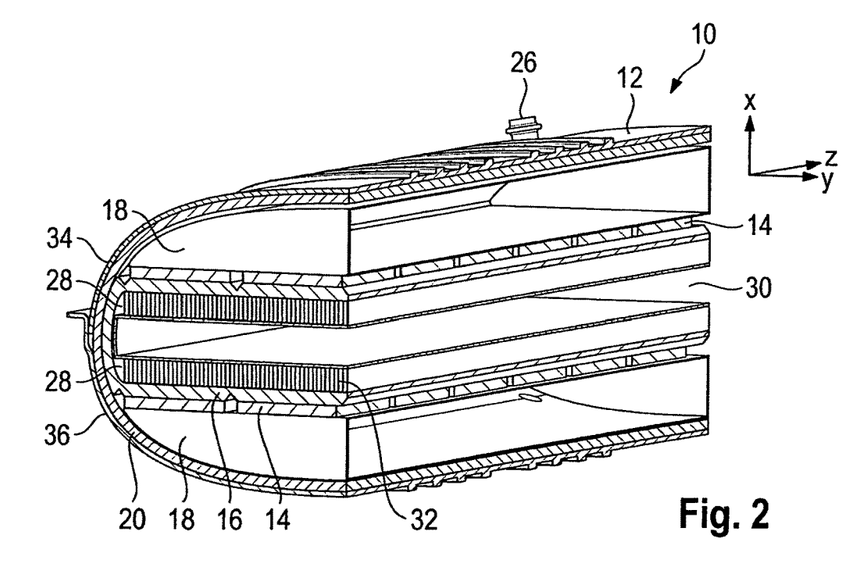
FIG. 2 shows a schematic perspective longitudinal section through the thermoelectric generator unit in FIG. 1.

The inner tube 16 has a substantially rectangular cross-section and is dimensioned such that, as seen in cross-section perpendicular to the longitudinal axis, it is arranged parallel to the long axis (in the Figures in direction y) and substantially fills out the outer housing 12 in this direction. Merely the elastic compensation element 20 is provided between the narrow sides 22 of the inner tube 16 and the inner wall of the outer housing 12. The narrow sides 22 are designed to be slightly curved so that they are adapted to the curvature of the outer housing wall in this area. The long sides of the inner tube 16, however, form flat portions 24. A number of thermoelectric modules 14 is arranged on these flat portions 24 as close to each other as possible. This is also indicated in FIG. 2.

In this case, the thermoelectric modules 14 are glued or pressed to a contiguous side wall of the inner tube 16. However, it would also be possible (not shown) to provide recesses in the flat portions 24, which are covered by the face of the thermoelectric modules 14 so that their high-temperature side is in direct contact with the hot exhaust gas flowing through the inner tube 16.

On the low-temperature side of the thermoelectric modules 14, the cooling element 18 realized as a hollow body is arranged such that its flat side rests directly on the thermoelectric modules 14.

In this example, the thermal coupling is achieved by pressing or gluing, likewise with a heat-conductive gluing agent.

However, it is also possible (not illustrated) to provide recesses in the cooling element 18 in the flat side, which are covered by the thermoelectric modules 14 so that the low-temperature side of the thermoelectric modules 14 is in direct contact with the cooling agent flowing through the cooling element 18.

Each of the two cooling elements 18 extends across the entire axial length (in direction z) of the inner tube 16, which is equipped with thermoelectric modules 14. At one axial end, the cooling element 18 comprises an inlet 26, whereas it has an outlet 26' at the other axial end. Cooling agent flows through the inlet 26 into the cooling element 18 and flows out through the outlet 26'. In this case, the inlet 26 as well as the outlet 26' are arranged on the radial outer side of the cooling element 18 so that they protrude through the wall of the outer housing 12. With respect to the long axis of the oval, i.e. in direction y of the outer housing 12, inlet 26 and outlet 26' are arranged with an offset to effect a uniform flow through the cooling element 18. Inlet 26 and outlet 26' of the cooling element 18 are connected to an external cooling circuit not shown in more detail here.

The assembly unit made up of the inner tube 16, the thermoelectric modules 14, and the cooling elements 18 completely fills out the cross-sectional area of the outer housing 12 (except for the elastic compensation element 20).

In this example, an inserted and bent sheet metal structure divides the inner tube 16 in three channels in total, namely two parallel gas-carrying outer channels 28 and one bypass channel 30 disposed between the two gas-carrying outer channels 28.

As can be seen in FIG. 2, the bypass channel 30 is defined by its own tube inserted in the inner tube 16.

In each of the gas-carrying outer channels 28, a plurality of ribs 32 is formed which are perpendicular to the long axis y. The ribs slow down the flow of the exhaust gas and absorb the heat from the exhaust gas and deliver it to the outer wall of the inner tube 16. The bypass channel 30, however, is devoid of any flow obstructions.

A closure mechanism (not illustrated), e.g. in the form of a known flap valve, allows the bypass channel 30 to open upon exceeding a specific exhaust gas temperature so that a major part of the exhaust gas flowing through the inner tube 16 flows through the bypass channel, 30 and hence has a sufficient distance from the thermoelectric modules 14 so that these are not damaged by the high temperature. If there are temperatures which are suitable for the thermoelectric modules 14, the bypass channel 30 is closed by a flap and the exhaust gas flows entirely through the two gas-carrying outer channels 28. Due to the flow-obstructive ribs 32 in the gas-carrying outer channels 28, it is not necessary to provide a closure mechanism of its own here. The flow resistance of the bypass channel 30 is selected such that a major part of the exhaust gas flows through the bypass channel 30 when it is open and only a small portion of the exhaust gas flows through the gas-carrying outer channels 28 so that an excessively high thermal load of the thermoelectric modules 14 cannot occur.

The outer wall of the inner tube 16 and of the gas-carrying outer channels 28 may comprise notches, as illustrated in FIGS. 1 and 2, which are provided in axial direction z at the transition to the narrow sides 22 and between the thermoelectric modules 14, for reducing a heat transfer along the wall of the inner tube 16.

Here, the outer housing 12 is comprised of two thin-walled sheet metal shells 34, 36, which are connected to each other approximately at the level of the long axis y of the outer housing 12. For installing it in the outer housing 12, the assembly unit made up of inner tube 16, thermoelectric modules 14, and cooling elements 18 is wrapped with the elastic compensation element 20 and placed in one of the shells 34, 36. Subsequently, the other shell 36, 34 is put on the assembly unit and is connected to the first shell 34, 36 in a form-fitting manner such that the assembly unit is clamped between the shells 34, 36.

With this arrangement, the main clamping force applied by the housing is oriented to be mainly parallel to the thermoelectric modules 14 (direction y), as the shells 34, 36 due to the large radius are more resilient and elastic in the middle region than in the peripheral areas which have a more pronounced curvature.

Figure 5:
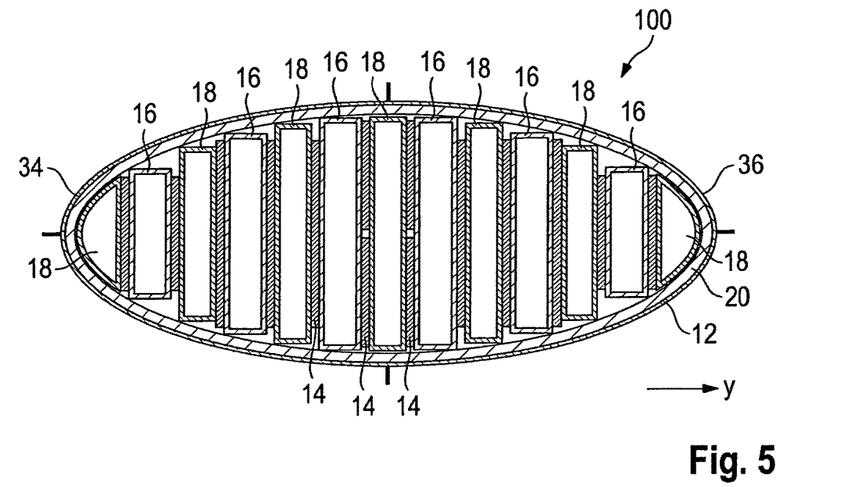
FIG. 5 shows a schematic cross-sectional view of a thermoelectric generator unit of the invention according to a second embodiment in a first variant.
Figures 6, 7:
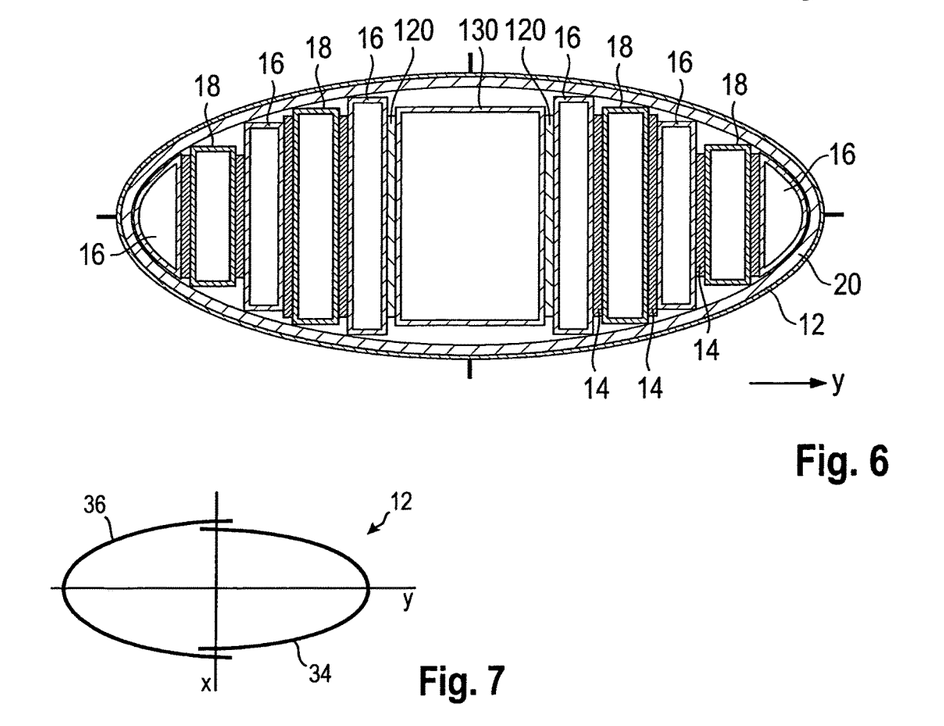
FIG. 6 shows a schematic cross-sectional view of a thermoelectric generator unit of the invention according to a further embodiment.
FIG. 7 shows a schematic sectional view of an outer housing of a thermoelectric generator unit of the invention.

As indicated in FIGS. 5 to 7, the shells 34, 36 may also abut each other at the level of the short axis x of the outer housing 12 and be connected to each other in this area so that the shells 34, 36 are c-shaped each and have a pronounced curvature.

In this case, the main clamping force applied by the housing is oriented to be mainly perpendicular to the thermoelectric modules 14, i.e. in direction y, due to the curvature of the housing.

However, any other known canning technologies could also be used for manufacturing the outer housing 12.

Figure 4:
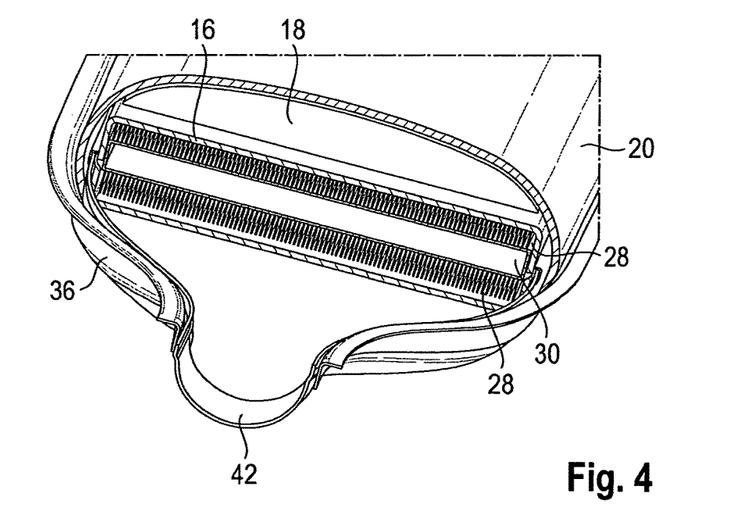
FIG. 4 shows a schematic perspective sectional view of an end portion of the thermoelectric generator unit in FIG. 3, with a part of the outer housing being removed.

On the whole, the thermoelectric generator unit 10 has an inlet end 38 and an outlet end 40, as illustrated in FIG. 3. At the inlet and outlet ends 38, 40, the outer housing 12 tapers in a circular cross-section which is adapted to the diameter of the exhaust gas pipe into which the thermoelectric generator unit 10 is installed (not shown in more detail). FIG. 4 shows a view into the inlet end 38 (or outlet end 40). A guide surface 42 is arranged within the outer housing 12 such that the full exhaust gas flow is directed into the inner tube 16. This is why the guide surface 42 terminates with the inner tube 16 in axial direction and in circumferential direction. It is only provided in the region of the inlet and outlet ends 38, 40. This is to ensure that the whole exhaust gas flows through the inner tube 16, either only through the two gas-carrying outer channels 28 or else through the bypass channel 30.

FIG. 5 shows a second embodiment of a thermoelectric generator unit 100.

In this case, a plurality of inner tubes 16 defining separate gas-carrying channels are provided, among which the hot exhaust gas flowing into an entrance area (not shown) is distributed. Cooling elements 18 carrying an internal flow of a cooling fluid are arranged between the inner tubes 16 in each case. Depending on the size of the flat portions of the inner tubes 16 and the cooling elements 18, one or more thermoelectric modules 14 are provided between an inner tube 16 and a neighboring cooling element 18 (not all of the thermoelectric modules 14 in FIGS. 5 and 6 are provided with a reference numeral).

In contrast to the embodiment which has just been described, the inner tubes 16, the thermoelectric modules 14 arranged parallel thereto, and the cooling elements 18 are arranged perpendicular to the long axis y, i.e. perpendicular to the direction y.

Here too, the assembly unit made up of inner tubes 16, thermoelectric modules 14, and cooling elements 18 is surrounded by an elastic compensation element 20 in the form of a supporting mat and is received in an oval, metallic outer housing 12 made of two shells 34, 36. The shells 34, 36 are designed here such that they meet each other at the short axis x of the outer housing 12 and are fastened to each other in this area. This increases the clamping effect and simplifies the assembly.

The shells 34,36 are designed such, for example, that they can be pushed into each other along the long axis y in direction y by a short distance. This is shown in FIG. 7. The overlapping portions of the two shells 34,36 lying flat on top of each other are connected to each other by soldering or welding in the form of a substance-to-substance bond. This allows a very precise adaptation of the clamping force exerted on the inner tubes 16 and the thermoelectric modules 14.

The process of pushing the shells 34, 36 towards each other also applies to the remaining embodiments, and is performed in particular in a force-controlled or distance-controlled manner with detection of the clamping force or the traveled pushing distance.

The cooling elements 18, which are farthest outside in direction y, are rounded at their outer side and adapted to the curvature of the outer housing 12.

FIG. 6 shows a variant 100' of the thermoelectric generator unit 100 just described. In this case, an inner tube 16 arranged in the middle of the outer housing is formed as a bypass channel 130 which has a larger cross-section than the largest one of the inner tubes 16 of the variant just described. In addition, the bypass channel 130 is thermally insulated with an elastic compensation element 120, here again a supporting mat, at its sides facing the two neighboring inner tubes 16. The distribution of the hot exhaust gas among the remaining inner tubes 16 and the bypass channel 130 is performed in the manner described in the first embodiment for the gas-carrying outer channels 28 and the bypass channel 30. In the arrangement shown here, each of the outermost channel elements is an inner tube 16 and no cooling element 18. In this case, the outermost inner tubes 16 are equipped with a curved wall to adapt them to the shape of the outer housing 12.

It goes without saying that a higher or smaller number of inner tubes 16 and cooling elements 18 may be provided in the outer housing 12. Accordingly, the element which is farthest outward in direction y may be a cooling element 18 or an inner tube 16.

In an embodiment which is not shown, the inner tube 16 forming the bypass channel 130 is arranged in the sectional view on one of the curved short sides of the outer housing 12. Thus, the bypass channel 130 represents the outermost element of the elements through which the exhaust gas or cooling fluid flows and is directly adjacent to the housing wall, separated from it only through the compensation element 20.

In these examples, the bypass channel 130 is realized to have a larger cross-section than each of the individual inner tubes 16 so that a major part or the whole of the exhaust gas may substantially flow through the bypass channel 130 when the latter is activated in addition.

Although an embodiment of this invention has been disclosed, a worker of ordinary skill in this art would recognize that certain modifications would come within the scope of this disclosure. For that reason, the following claims should be studied to determine the true scope and content of this disclosure.

The invention claimed is:

1. A thermoelectric generator unit, in particular for coupling to an exhaust gas pipe of an internal combustion engine, comprising:
   at least one inner tube having gas flowing therein and an outer circumference that comprises at least one flat portion,
   an oval outer housing completely surrounding at least one the inner tube in a circumferential direction, and wherein the outer housing comprises two housing shells which meet each other at a short axis area of the outer housing and are fastened to each other in this area,
   a plurality of thermoelectric modules arranged on the at least one flat portion of the at least one inner tube,
   at least one cooling element comprising a cooling channel having an outer wall with a flat side on which the thermoelectric modules are arranged, wherein a first portion of an outer circumference of the outer wall substantially corresponds to a curvature of the outer housing and a second portion of the outer circumference of the outer wall is substantially flat,
   an assembly unit made up of the at least one inner tube, the plurality of thermoelectric modules, and the at least one cooling element, the assembly unit being surrounded by an elastic compensation element that rests on an inner side of the outer housing and is retained in the outer housing by clamping, and
   wherein at least one gas-carrying channel and a bypass channel are provided in an interior of the other housing, and wherein hot gas can be selectively directed through the at least one gas-carrying channel and/or the bypass channel.

2. The thermoelectric generator unit according to claim 1, wherein an inlet and/or an outlet for the at least one cooling element is arranged on a lateral surface of the outer housing.

3. A thermoelectric generator unit, in particular for coupling to an exhaust gas pipe of an internal combustion engine, comprising:
   at least one inner tube having gas flowing therein and an outer circumference, that comprises at least one flat portion,
   an oval outer housing completely surrounding at least one the inner tube in a circumferential direction, and wherein the outer housing comprises two housing shells which meet each other at a short axis area of the outer housing and are fastened to each other in this area,
   a plurality of thermoelectric modules arranged on the at least one flat portion of the at least one inner tube,
   at least one cooling element comprising a cooling channel having an outer wall with a flat side on which the thermoelectric modules are arranged, wherein a first portion of an outer circumference of the outer wall substantially corresponds to a curvature of the outer housing and a second portion of the outer circumference of the outer wall is substantially flat, an assembly unit made up of the at least one inner tube, the plurality of thermoelectric modules, and the at least one cooling element, the assembly unit being surrounded by an elastic compensation element that rests on an inner side of the outer housing and is retained in the outer housing by clamping, and wherein the at least one inner tube comprises at least three inner tubes that form at least two gas-carrying outer channels and a bypass channel arranged therebetween, and wherein hot gas can be selectively directed through the at least two gas-carrying outer channels and/or the bypass channel.

4. A thermoelectric generator unit, in particular for coupling to an exhaust gas pipe of an internal combustion engine, comprising:

at least one inner tube having gas flowing therein and an outer circumference that comprises at least one flat portion, an oval outer housing completely surrounding at least one the inner tube in a circumferential direction, and wherein the outer housing comprises two housing shells which meet each other at a short axis area of the outer housing and are fastened to each other in this area, a plurality of thermoelectric modules arranged cm the at least one Hat portion of the at least one inner tube, at least one cooling element comprising a cooling channel having an outer wall with a flat side on which the thermoelectric modules are arranged, wherein a first portion of an outer circumference of the outer wall substantially corresponds to a curvature of the outer housing and a second portion of the outer circumference of the outer wall is substantially flat, an assembly unit made up of the at least one inner tube, the plurality of thermoelectric modules, and the at least one cooling element, the assembly unit being surrounded by an elastic compensation element that rests on an inner side of the outer housing and is retained in the outer housing by clamping, and wherein the at least one inner tube is divided to have at least two outer channels and a bypass channel arranged therebetween, and wherein hot gas can be selectively directed through the at least two outer channels and/or the bypass channel.

5. The thermoelectric generator unit according to claim 1, including a plurality of parallel inner tubes, each having a wide side arranged to be perpendicular to a long axis of a cross-section of the oval outer housing.

6. The thermoelectric generator unit according to claim 1, wherein the housing shells are pushed into each other.

7. A thermoelectric generator unit, in particular for coupling to an exhaust gas pipe of an internal combustion engine, comprising:

at least one inner tube having gas flowing therein and an outer circumference that comprises at least one flat portion, an oval outer housing completely surrounding at least one the inner tube in a circumferential direction, and wherein the outer housing comprises two housing shells which meet each other at a short axis area of the outer housing and are fastened to each other in this area, a plurality of thermoelectric modules arranged on the at least one flat portion of the at least one inner tube, at least one cooling element comprising a cooling channel having an outer wall with a flat side one which the thermoelectric modules are arranged, wherein a first portion of an outer circumference of the outer wall substantially corresponds to a curvature of the outer housing and a second portion of the outer circumference of the outer wall is substantially flat, an assembly unit made up of the at least one inner tube, the plurality of thermoelectric modules, and the at least one cooling element, the assembly unit being surrounded by an elastic compensation element that rests on an inner side of the outer housing and is retained in the outer housing by clamping, and wherein a bypass channel is arranged in a middle of the outer housing and is thermally isolated at both sides with respect to adjoining inner tubes.

8. The thermoelectric generator unit according to claim 1, wherein the thermoelectric modules are arranged such that module end faces are not in contact with the elastic compensation element.

9. The thermoelectric generator unit according to claim 1, wherein the housing shells are pushed into each other.

10. The thermoelectric generator unit according to claim 4, wherein the bypass channel comprises a bypass tube received within the at least one inner tube, and including a first plurality of ribs extending from an outer surface on one side of the bypass tube to an inner surface of the at least one inner tube and a second plurality of ribs extending from the outer surface on an opposite side of the bypass tube to the inner surface of the at least one inner tube.

11. The thermoelectric generator unit according to claim 10, wherein the bypass tube has a rectangular cross-section and defines a bypass path that is free from obstructions.

12. The thermoelectric generator unit according to claim 1, wherein the at least one cooling element comprises a first cooling channel having an outer wall with a flat side on which one set of the thermoelectric modules is arranged and a second cooling channel having an out outer wall with a flat side on which another set of the thermoelectric modules is arranged, and wherein the first cooling channel is positioned on one side of the at least one inner tube and the second cooling channel is positioned on an opposite side of the at least one inner tube.

13. The thermoelectric generator unit according to claim 12, wherein the one set of the thermoelectric modules is arranged directly between the first cooling channel and the at least one inner tube and the other set of the thermoelectric modules is arranged directly between the second cooling channel and the at least one inner tube.

* * * * *

UNITED STATES PATENT AND TRADEMARK OFFICE
CERTIFICATE OF CORRECTION

PATENT NO. : 10,193,049 B2
APPLICATION NO. : 14/004189
DATED : January 29, 2019
INVENTOR(S) : Christian Paul Vitek and Boris Kienle It is certified that error appears in the above-identified patent and that said Letters Patent is hereby corrected as shown below:

In the Claims

In Claim 3, Column 8, Line 53; replace "circumference, that" with --circumference that--

In Claim 4, Column 9, Line 21-22; replace "at least one the inner tube" with --the at least one inner tube--

In Claim 4, Column 9, Line 27-28; replace "arranged cm the at least one Hat portion" with --arranged on the at least one flat portion--

In Claim 7, Column 10, Line 1; replace "at least one the inner tube" with --the at least one inner tube--

In Claim 7, Column 10, Line 10; replace "a flat side one which" with --a flat side on which--

In Claim 12, Column 10, Line 46; replace "an out outer wall" with --an outer wall--

Signed and Sealed this
Twenty-eighth Day of June, 2022

Katherine Kelly Vidal
*Director of the United States Patent and Trademark Office*